(12) United States Patent
Wilby et al.

(10) Patent No.: US 9,818,658 B2
(45) Date of Patent: Nov. 14, 2017

(54) SEMICONDUCTOR WAFER PROCESSING METHODS AND APPARATUS

(71) Applicant: METRYX LIMITED, Bristol (GB)

(72) Inventors: Robert John Wilby, Bristol (GB); Adrian Kiermasz, Bristol (GB)

(73) Assignee: METRYX LIMITED, Bristol (GB)

( * ) Notice: Subject to any disclaimer, the term of this patent is extended or adjusted under 35 U.S.C. 154(b) by 0 days.

(21) Appl. No.: 15/039,759

(22) PCT Filed: Nov. 3, 2014

(86) PCT No.: PCT/GB2014/053258
§ 371 (c)(1),
(2) Date: May 26, 2016

(87) PCT Pub. No.: WO2015/082874
PCT Pub. Date: Jun. 11, 2015

(65) Prior Publication Data
US 2017/0005019 A1    Jan. 5, 2017

(30) Foreign Application Priority Data

Dec. 4, 2013    (GB) .................................. 1321423.4

(51) Int. Cl.
*H01L 21/66* (2006.01)
*H01L 21/67* (2006.01)
*H01L 21/677* (2006.01)
(52) U.S. Cl.
CPC ........ *H01L 22/26* (2013.01); *H01L 21/67103* (2013.01); *H01L 21/67109* (2013.01); *H01L 21/67248* (2013.01); *H01L 21/67706* (2013.01)

(58) Field of Classification Search
CPC ............... H01L 22/26; H01L 21/67103; H01L 21/67109; H01L 21/67248; H01L 21/67706
See application file for complete search history.

(56) References Cited

U.S. PATENT DOCUMENTS

| | | | |
|---|---|---|---|
| 6,341,903 B1* | 1/2002 | Ueda ................. | H01L 21/67178 118/52 |
| 6,515,731 B1* | 2/2003 | Akimoto ........... | H01L 21/67109 355/27 |
| 2012/0107757 A1 | 5/2012 | Reitinger | |

* cited by examiner

*Primary Examiner* — Karen Kusumakar
(74) *Attorney, Agent, or Firm* — Buchanan Ingersoll & Rooney PC

(57) ABSTRACT

A semiconductor wafer processing method comprising controlling the temperature of a semiconductor wafer to be within a predetermined processing temperature range by: causing a first temperature change of the semiconductor wafer using a first temperature changing unit; and subsequently causing a second temperature change using a second temperature changing unit; wherein the first change is greater than the second change; and subsequently loading the semiconductor wafer on a processing area of a semiconductor wafer processing apparatus. Also, a semiconductor wafer processing method comprising controlling the temperature of a semiconductor wafer to be within a predetermined processing temperature range by causing a temperature change of the semiconductor wafer using a temperature changing unit; transporting the semiconductor wafer from the temperature changing unit to a processing area of a semiconductor wafer processing apparatus; and controlling the temperature of the semiconductor wafer during the transporting step.

20 Claims, 3 Drawing Sheets

SEMICONDUCTOR WAFER PROCESSING METHODS AND APPARATUS

CROSS-REFERENCE TO RELATED APPLICATIONS

This application is a U.S. National Stage Application under 35 U.S.C. §371 of International Patent Application No. PCT/GB2014/053258, filed Nov. 3, 2014 which claims priority to Great Britain Application No. 1321423.4, filed Dec. 4, 2013, which are hereby incorporated by reference in their respective entireties.

FIELD OF THE INVENTION

The present invention relates to a semiconductor wafer processing method, for example a semiconductor wafer metrology method.

The present invention also relates to a semiconductor wafer processing apparatus, for example a semiconductor wafer metrology apparatus.

BACKGROUND OF THE INVENTION

Microelectronic devices are fabricated on semiconductor (e.g. silicon) wafers using a variety of techniques, e.g. including deposition techniques (CVD, PECVD, PVD, etc.) and removal techniques (e.g. chemical etching, CMP, etc.). Semiconductor wafers may be further treated in ways that alter their mass, e.g. by cleaning, ion implantation, lithography and the like.

Depending on the device being manufactured, each semiconductor wafer may be passed sequentially through hundreds of different processing steps to build up and/or to remove the layers and materials necessary for its ultimate operation. In effect, each semiconductor wafer is passed down a production line. The nature of semiconductor manufacturing means that certain processing steps or sequences of steps in the production flow may be repeated in a similar or identical fashion. For example, this may be to build up similar layers of metal conductors to interconnect different parts of the active circuitry.

To ensure consistency and interoperability of semiconductor equipment used in different factories, standards are adopted throughout the majority of the semiconductor manufacturing industry. For example, standards developed by Semiconductor Equipment and Materials International (SEMI) have a high degree of market uptake. One example of standardisation is the size and shape of the semiconductor (silicon) wafers: typically for volume production they are discs having a diameter of 300 mm. However, some semiconductor (silicon) wafers (typically used in older factories) are discs having a diameter of 200 mm.

The cost and complexity of the processing steps required to produce a completed silicon wafer, together with the time that it takes to reach the end of the production line where its operation can be properly assessed, has led to a desire to monitor the operation of the equipment on the production line and the quality of the wafers being processed throughout processing, so that confidence in the performance and yield of the final wafers may be assured.

Wafer treatment techniques typically cause a change in mass of the semiconductor wafer (e.g. at or on the surface of the semiconductor wafer or in the bulk of the semiconductor wafer). The configuration of the changes to the semiconductor wafer are often vital to the functioning of the device, so it is desirable for quality control purposes to assess wafers during production in order to determine whether they have the correct configuration.

Specialist metrology tools may be used within the production flow so that monitoring is conducted soon after the relevant process of interest and usually before any subsequent processing, i.e. between processing steps.

Measuring the change in mass of a wafer either side of a processing step is an attractive method for implementing product wafer metrology. It is relatively low cost, high speed and can accommodate different wafer circuitry patterns automatically. In addition, it can often provide results of higher accuracy than alternative techniques. For example, on many typical materials, thicknesses of material layers can be resolved down to an atomic scale. The wafer in question is weighed before and after the processing step of interest. The change in mass is correlated to the performance of the production equipment and/or the desired properties of the wafer.

Processing steps carried out on semiconductor wafers can cause very small changes in the mass of the semiconductor wafer, which it may be desirable to measure with high accuracy. For example, removing a small amount of material from the surface of the semiconductor wafer may reduce the mass of the semiconductor wafer by a few milligrams, and it may be desirable to measure this change with a resolution of the order of ±100 μg or better. Semiconductor wafer metrology methods and apparatus that are capable of measuring the change in mass of a semiconductor wafer to a resolution of around ±10 μg are in development, and methods and apparatus with a resolution of around ±100 μg are commercially available.

At these high levels of measurement accuracy, errors in the measurement output caused by temperature variations in the semiconductor wafers being measured or in the temperature of the measurement balance may become significant. For example, a temperature difference of approximately 0.005° C. between the semiconductor wafer and (a part of) the measurement balance or enclosure may cause an error of approximately 5 μg in the determined mass (or change in mass) of the semiconductor wafer. Variations in temperature between different parts of the measurement apparatus (i.e. temperature non-uniformity), e.g. caused by a heat load from semiconductor wafers being measured using the measurement apparatus, will cause errors in the measurement output. In addition, if the semiconductor wafers have a higher temperature than a measurement enclosure of the measurement apparatus, air currents (e.g. convection currents) may be generated in the air in the measurement enclosure, which may affect the measurement output. In addition, the air in the measurement enclosure may be heated, changing its density and pressure and therefore the buoyancy force exerted on the semiconductor wafer by the air. This may also affect the measurement output. The magnitudes of these effects are generally considered insignificant and are ignored (or not detected) in lower accuracy mass measurements, for example measurements performed with a resolution of the order of milligrams.

Temperature changes occurring slowly over a relatively long period of time (e.g. of the order of hours) may be essentially accounted for by periodically calibrating the measurement apparatus, or may be essentially subtracted out by performing comparative measurements. However, temperature changes occurring more rapidly (e.g. due to a high heat load from a plurality of semiconductor wafers) may be more difficult to account for or to subtract out in the same way.

The temperature of a semiconductor wafer immediately after it has been processed in a production line may be 400-500° C. or higher. After processing the semiconductor wafer may be loaded into a Front Opening Unified Pod (FOUP) together with other recently processed semiconductor wafers (e.g. 25 in total) for transportation between different processing locations of the production line. When the FOUP arrives at a different processing location, for example a weighing device for weighing the semiconductor wafers, the temperature of the semiconductor wafers may still be high, for example 70° C. or higher. In contrast, the temperature of the processing location, e.g. the weighing device, may be approximately 20° C. Therefore, there may be a significant temperature difference between the semiconductor wafers and the weighing device. As discussed above, a significant temperature difference between the semiconductor wafer and the weighing device may cause convection currents in the weighing device, and/or changes in the buoyancy force experienced by the semiconductor wafer (due to changes in the air density and/or pressure) and/or thermal variation (i.e. temperature changes and/or temperature non-uniformity) in a weighing balance of the weighing device, which may cause errors in the weight measurements. For high accuracy weight measurements, even errors caused by very small temperature differences (e.g. less than 1° C., for example 0.001° C.) may be significant (e.g. detectable).

WO 02/02449 describes a semiconductor wafer metrology method that aims to reduce errors in the measurement output caused by temperature variations in the measurement balance or of the semiconductor wafers being measured. In the method described in WO 02/02449 a semiconductor wafer is removed from a Front Opening Unified Pod (FOUP) and placed on a passive thermal transfer plate that is thermally coupled to a chamber of the weighing apparatus before it is placed on a measurement area of the weighing apparatus. The passive thermal transfer plate equalises the temperature of the semiconductor wafer to the temperature of the chamber to within ±0.1° C. This temperature equalisation may reduce the possibility of any convection currents arising within the balance, which would cause errors in the measurement output, and also may reduce any thermal variation in the balance itself, which would also cause errors in the measurement output. This method therefore may make the measurement output more accurate, relative to a method in which there is no temperature equalisation of the semiconductor wafer before taking the measurement.

SUMMARY OF THE INVENTION

The present inventors have realised that there may a significant heat load on the chamber of the weighing apparatus in the method described in WO 02/02449. For example, when performing a sequence of weight measurements on a sequence of semiconductor wafers in which the semiconductor wafers are cooled from approximately 70° C. to approximately 20° C. by the thermal transfer plate before performing the weight measurements, there may be a heat load of the order of tens of Watts on the chamber of the weighing apparatus, for example a heat load of approximately 50 W-100 W, e.g. 75 W (assuming approximately 60 wafers per hour).

This heat load may cause the temperature of the weighing apparatus (e.g. the temperature of a balance of the weighing apparatus) to increase or to become non-uniform, which may cause corresponding errors in the weight measurements performed by the weighing apparatus. In addition, this heat load can cause air currents (e.g. convection currents) and changes in the air density and pressure around the balance, which can also cause corresponding errors in the weight measurements performed by the weighing apparatus. As a consequence, the accuracy of the weighing apparatus may be reduced. These effects may be significant (e.g. detectable) when performing high accuracy measurements, for example measurements with an accuracy of around ±100 μg or better. For example, a change (or error) in the measurement output may be observed when the first (or a single isolated) semiconductor wafer is measured using the weighing apparatus, due to the convection currents and changes in air density caused by the temperature difference between that semiconductor wafer and the weighing apparatus.

There therefore exists a problem of better controlling the temperature of the semiconductor wafer on the weighing apparatus in order to improve the accuracy of the measurement performed by the weighing apparatus.

The present inventors have realised that the accuracy of the measurement performed by the weighing apparatus can be improved by removing the bulk of the heat load from the semiconductor wafer before using the thermal transfer plate to equalise the temperature of the semiconductor wafer to the temperature of the weighing apparatus. In other words, the present inventors have realised that the accuracy can be improved by separating the step of removing the bulk of the heat load from the semiconductor wafer from the step of equalising the temperature of the semiconductor wafer to the desired temperature. If the bulk of the heat load is removed from the semiconductor wafer before using e.g. a thermal transfer plate to equalise the temperature of the semiconductor wafer to the temperature of the weighing apparatus, the head load on the thermal transfer plate during the temperature equalisation will be low. Therefore, the temperature of the thermal transfer plate should not change significantly during the temperature equalisation, and the temperature of the semiconductor wafer will therefore be more accurately/precisely equalised to the desired temperature (i.e. the original temperature of the thermal transfer plate).

The heat load on the weighing apparatus during the temperature equalisation will be significantly reduced relative to the method described in WO 02/02449 if the bulk (e.g. the majority, or more than half) of the heat load of the semiconductor wafer is removed (e.g. the semiconductor wafer is cooled to a temperature close to the temperature of the weighing apparatus) before the temperature of the semiconductor wafer is equalised to the temperature of the weighing apparatus.

Therefore, the temperature of the weighing apparatus should not change significantly because of the temperature equalisation, even when performing sequential measurements on a plurality of semiconductor wafers having relatively high starting temperatures (e.g. 70° C. or over). As such, the temperature of the semiconductor wafer when it is loaded on to a measurement area of the weighing apparatus and/or the temperature and/or the temperature uniformity of the measurement area of the weighing apparatus may be more accurately controlled, and as a consequence the accuracy of the weight measurements performed by the weighing apparatus may be improved.

The present inventors have also realised that the concept of removing the bulk of a heat load from a semiconductor wafer before equalising the temperature of the semiconductor wafer to a measurement temperature is generally applicable to other semiconductor wafer processing apparatus and methods in which the temperature of a semiconductor wafer needs to be substantially equalised to a predetermined processing temperature.

Furthermore, the present inventors have realised that the same principles apply when it is desired to heat a semiconductor wafer to a desired processing temperature. In other words, the temperature matching to the desired (higher) processing temperature can be performed more accurately by separating the step of transferring the bulk of the heat load to the semiconductor wafer from the step of equalising the temperature of the semiconductor wafer to the desired processing temperature.

Therefore, at its most general the present invention relates to a semiconductor wafer processing method in which the bulk of a heat load of a semiconductor wafer is removed from, or transferred to, the semiconductor wafer before the temperature of the semiconductor wafer is substantially equalised to a predetermined processing temperature.

According to a first aspect of the present invention there is provided a semiconductor wafer processing method comprising:

controlling the temperature of a semiconductor wafer to be within a predetermined processing temperature range by:
causing a first change in the temperature of the semiconductor using a first temperature changing unit; and
subsequently causing a second change in the temperature of the semiconductor wafer using a second temperature changing unit;
wherein the magnitude of the first change is greater than the magnitude of the second change; and
subsequently loading the semiconductor wafer on to a processing area of a semiconductor wafer processing apparatus.

In the method according to the first aspect of the present invention the temperature of the semiconductor wafer is controlled to be within a predetermined processing temperature range by two steps. In the first step, the temperature of the semiconductor wafer is changed (increased or decreased) by a greater amount using the first temperature changing unit. In the second step, the temperature of the semiconductor wafer is changed (increased or decreased) by a lesser amount using the second temperature changing unit.

Therefore, the majority of the temperature change of the semiconductor wafer is achieved using the first temperature changing unit before the second temperature changing unit is used to control the temperature of the semiconductor wafer to be within the predetermined processing temperature range. As such, the heat load on the second temperature changing unit may be significantly reduced relative to an arrangement that does not include the first step of changing the temperature of the semiconductor wafer using a first temperature changing unit.

The reduced heat load on the second temperature changing unit means that any temperature change of the second temperature changing unit as a consequence of the heat load is reduced. As such, the temperature of the semiconductor wafer can be more accurately controlled using the second temperature changing unit, relative to the conventional methods. This may allow the temperature of the semiconductor wafer on the processing area and/or the temperature (and/or temperature uniformity) of the processing area to be controlled more precisely or more accurately than is possible with the conventional methods. As a consequence, the processing may be performed more accurately.

For example, where the temperature of the semiconductor wafer is controlled to be substantially the same as the temperature of the processing area, any errors caused by temperature differences may be substantially avoided as the temperature difference may be substantially zero. Where the temperature of the semiconductor wafer is instead controlled to be a different temperature to the temperature of the processing area, any errors caused by temperature differences may be substantially the same for each semiconductor wafer, and may therefore be predicted and/or substantially removed by doing comparative measurements (i.e. subtracting pre-processing and post-processing measurements to determine a mass change of the semiconductor wafer caused by the processing).

The method according to the first aspect of the present invention may have any one, or, to the extent that they are compatible, any combination of the following optional features.

The first temperature changing unit and the second temperature changing unit may be thermally insulated from each other, e.g. separated by a thermal insulator such as an air gap or a layer of thermally insulating material.

A temperature changing unit may be any device that can be used to increase or to decrease (i.e. to change) the temperature of the semiconductor wafer, e.g. a heating unit/heater or a cooling unit/cooler.

Causing the second change in the temperature of the semiconductor wafer using the second temperature changing unit may comprise bringing the semiconductor wafer substantially into thermal equilibrium with the second temperature changing unit.

Causing the second change in the temperature of the semiconductor wafer using the second temperature changing unit may comprise bringing the semiconductor wafer and the second temperature changing unit into physical contact, e.g. direct physical contact.

Causing the second change in the temperature of the semiconductor wafer using the second temperature changing unit may comprise substantially equalising or matching the temperature of the semiconductor wafer to the temperature of the second temperature changing unit.

The magnitude of the first temperature change may comprise at least 80%, or at least 90%, or at least 95% of the sum of the magnitudes of the first and second temperature changes. Therefore, the bulk of the heat load of the semiconductor wafer may be removed from, or added to, the semiconductor wafer by the first temperature changing unit. As a consequence, the heat load on the second temperature changing unit when it is used to cause the second change in the temperature of the semiconductor wafer is reduced, and the temperature of the semiconductor wafer can be more accurately/precisely matched to the desired temperature.

Causing the first change in the temperature of the semiconductor wafer may comprise changing the temperature of the semiconductor wafer to be within ±3° C., or within ±2° C., or within ±1° C. of a predetermined processing temperature. In other words, the first change in the temperature of the semiconductor wafer may bring the temperature of the semiconductor wafer close (i.e. within a few ° C.) to the desired processing temperature, so that the second temperature changing unit only needs to cause a small change in the temperature of the semiconductor wafer (corresponding to adding or removing a small heat load from the semiconductor wafer).

Causing the second change in the temperature of the semiconductor wafer may comprise substantially equalising the temperature of the semiconductor wafer to a predetermined processing temperature. Therefore, the temperature equalisation may be carried out once the bulk of the heat load has been added to, or removed from, the semiconductor wafer, so that the temperature equalisation can be performed more accurately (due to the reduced heat load on the second temperature changing unit, which means that the temperature of the second temperature changing unit may not change significantly during the temperature equalisation).

Substantially equalising the temperature of the semiconductor wafer to a predetermined processing temperature means that the temperature of the semiconductor wafer is precisely controlled to a desired temperature (which may be the same as the temperature of the processing area, or a different temperature). As such, the temperature difference between the semiconductor wafer and the processing area may be substantially zero, so that substantially no errors are caused in the measurement output by the temperature difference. Alternatively, the temperature difference may be substantially the same for each semiconductor wafer, so that the error in the measurement output is substantially constant and can be predicted and/or cancelled out by comparative measurements (e.g. subtracting pre-processing and post-processing measurements to determine a mass change due to processing). The extent of the temperature equalisation may depend on the length of time for which the second temperature changing unit is used to change the temperature of the semiconductor wafer.

The predetermined processing temperature may be a temperature of the processing area of the semiconductor wafer processing apparatus. Therefore, the temperature of the semiconductor wafer may be substantially equalised (or matched) to the temperature of the processing area. As such, there may be substantially no temperature difference between the semiconductor wafer and the processing area.

Causing the second change in the temperature of the semiconductor wafer may comprise changing the temperature of the semiconductor wafer by less than 3° C., or less than 2° C., or less than 1° C. Therefore, the heat load on the second temperature changing unit may be low, as only a small heat load needs to be removed from, or input to, the semiconductor wafer to achieve the required temperature change. Therefore, the temperature of the second temperature changing unit may not change significantly during the second temperature change, and the temperature of the semiconductor wafer may therefore be changed more accurately/precisely.

The method may be a semiconductor wafer metrology method, the temperature of the semiconductor wafer may be controlled to be within a predetermined measurement temperature range, and the semiconductor wafer may be loaded on to a measurement area of a semiconductor wafer metrology apparatus.

The first temperature changing unit may comprise a first cooling unit, and causing the first change in the temperature of the semiconductor wafer may comprise cooling the semiconductor wafer using the first cooling unit. Therefore, the method may comprise cooling the semiconductor wafer to be within the predetermined processing temperature range. A cooling unit may be a device that removes heat from the semiconductor wafer to cool (i.e. reduce the temperature of) the semiconductor wafer.

The first cooling unit may extract heat from the semiconductor wafer and dissipate (or transport) that heat away from the processing area of the semiconductor wafer processing apparatus. Therefore, the heat removed from the semiconductor wafer when the semiconductor wafer is cooled using the first cooling unit is not transported into the processing area. As such, this heat may have substantially no effect on the temperature of the processing area and the temperature of the processing area may remain substantially constant.

The first cooling unit may actively dissipate heat removed from the semiconductor wafer. Actively dissipating heat may mean that the amount of heat dissipated by the first cooling unit is artificially increased through some means for removing heat from the first cooling unit. For example, actively dissipating heat from the first cooling unit may comprise artificially generating a flow of a fluid, e.g. a liquid or gas, through or from a part of the first cooling unit to actively remove heat from the first cooling unit. The method may comprise supplying power to the first cooling unit to cause the first cooling unit to actively dissipate heat.

Actively dissipating heat from the first cooling unit may prevent the temperature of the first cooling unit from increasing when causing the first temperature change of the semiconductor wafer. In particular, this may prevent the build-up of heat in the first cooling unit when processing a sequence of semiconductor wafers, where there may be a significant thermal load on the first cooling unit (which removes the bulk of the heat load from the semiconductor wafers). In other words, the bulk of the heat removed from the semiconductor wafers may be effectively/efficiently dissipated away by the first cooling unit.

The first cooling unit may comprise a thermoelectric cooler. A thermoelectric cooler may be a device that uses the Peltier effect to create a heat flux between a junction of two different types of material. In other words, the first cooling unit may comprise a thermoelectric heat pump device that transfers heat from one side of the device to the other. The cooling unit may comprise a Peltier cooler.

The first temperature changing unit may comprise a first thermal transfer plate.

A thermal transfer plate may be a heat-conductive body having a substantially flat (outer) surface.

The thermal transfer plate may have a surface area that is the same as, or greater than, the surface area of the semiconductor wafer, so that the temperature of the semiconductor wafer can be changed across the whole surface area of the semiconductor wafer (i.e. in a uniform manner).

The thermal transfer plate may have a good lateral (across the substantially flat surface) conductivity, so that the thermal transfer plate maintains a substantially uniform temperature across its surface. Therefore, the temperature of the semiconductor wafer may be changed substantially uniformly across the whole surface area of the semiconductor wafer.

The thermal transfer plate may have a high thermal mass, so that the temperature change of the thermal transfer plate in response to a heat load is small.

The second temperature changing unit may comprise a second cooling unit, and causing the second change in the temperature of the semiconductor wafer may comprise cooling the semiconductor wafer using the second cooling unit. Therefore, the semiconductor wafer may be cooled using the first cooling unit to a temperature above (e.g. by a few ° C.) the predetermined processing temperature range and then cooled using the second cooling unit to a temperature within the predetermined processing temperature range. Therefore, the bulk of the heat load of the semiconductor wafer may be removed using the first cooling unit and then the finer temperature matching or equalisation may be performed using the second cooling unit. As such, the heat load on the second cooling unit when causing the second temperature change may be reduced.

The second cooling unit may actively dissipate heat removed from the semiconductor wafer. Actively dissipating heat may mean that the amount of heat dissipated by the second cooling unit is artificially increased through some means for removing heat from the second cooling unit. For example, actively dissipating heat from the second cooling unit may comprise artificially generating a flow of a fluid, e.g. a liquid or gas, through or from a part of the second cooling unit to actively remove heat from the second cooling unit. The method may comprise supplying power to the second cooling unit to cause the second cooling unit to actively dissipate heat.

The second temperature changing unit may comprise a second thermal transfer plate, which may have the optional features of the first thermal transfer plate discussed above.

The second thermal transfer plate may have substantially the same temperature as the processing area of the semiconductor wafer processing apparatus. Therefore, the second thermal transfer plate may be used to substantially equalise or match the temperature of the semiconductor wafer to the temperature of the processing area. As such, any errors caused by differences in temperature between the semiconductor wafer and the processing area may be avoided or removed, because the temperature difference may be substantially zero. The extent of temperature equalisation may depend on the length of time for which the second thermal transfer plate is used to change the temperature of the semiconductor wafer.

The second thermal transfer plate may be thermally coupled to the processing area of the semiconductor wafer processing apparatus. For example, the second thermal transfer plate may be connected to the processing area by thermal conducting means having a high thermal conductivity. For example, the thermal transfer plate may be in direct contact with the processing area and may be bolted onto a surface of the processing area. The second thermal transfer plate may be substantially in thermal equilibrium with the processing area.

The second thermal transfer plate may be integral to the processing area of the semiconductor wafer processing apparatus. In other words, the second thermal transfer plate may be part of the processing area, e.g. it may be formed as one piece with the processing area. For example, the thermal transfer plate may formed on an outer surface of the processing area.

The method may comprise substantially equalising the temperature of the semiconductor wafer to the temperature of the processing area of the semiconductor wafer processing apparatus. As such, any errors caused by differences in temperature between the semiconductor wafer and the processing area may be avoided or removed, because the temperature difference may be substantially zero.

The semiconductor wafer processing apparatus may comprise a weighing apparatus, and the method may comprise determining information relating to the mass of the semiconductor wafer.

The method may comprise causing the first temperature change using a first cooling unit that has a temperature below the desired processing temperature (or equivalently using a first heating unit that has a temperature above the desired processing temperature, when the semiconductor wafer is being heated). The method may also comprise monitoring the temperature of the semiconductor wafer as it is being cooled by the first cooling unit (e.g. using a pyrometer) and removing the semiconductor wafer from the first cooling unit when the temperature of the semiconductor wafer is at a desired temperature (e.g. a temperature within a few degrees of the desired processing temperature). An advantage of using a first cooling unit having a temperature below the desired processing temperature (or equivalently a first heating unit having a temperature above the desired processing temperature) is that the first temperature change can be effected more quickly, due to the large temperature difference between the first cooling unit (or first heating unit) and the semiconductor wafer).

Instead of removing the semiconductor wafer from the first cooling unit when the temperature of the semiconductor wafer has reached the desired temperature, the temperature of the first cooling unit may instead be increased to the desired temperature from the temperature below the desired temperature after a predetermined period of time, or when the semiconductor wafer has reached the desired temperature. Thus, the first temperature change can be effected more quickly, but without requiring precise removal of the semiconductor wafer from the first cooling unit.

The method may comprise transporting the semiconductor wafer from the second temperature changing unit to the processing area of the semiconductor wafer processing apparatus, and controlling the temperature of the semiconductor wafer during the transporting step.

In conventional methods and apparatus, a semiconductor wafer is transported onto a processing area of a processing apparatus using a robotic arm of an Equipment Front End Module (EFEM). This generally involves moving the semiconductor wafer through a region of the EFEM in which there is a flow of air used to maintain a clean room environment in the EFEM or in a part of a processing apparatus connected to the EFEM. If such a conventional EFEM were used to move the semiconductor wafer from the second temperature changing unit to the processing area in the method according to the first aspect of the present invention the temperature of the semiconductor wafer may change during the transportation and may no longer be within the predetermined processing temperature range when the semiconductor wafer is loaded onto the processing area. By controlling the temperature of the semiconductor wafer during the transportation step the temperature of the semiconductor wafer when it is loaded on to the processing area may be better controlled. As such, errors due to temperature differences between the semiconductor wafer and the processing area may be avoided or made constant/predictable.

Indeed, the present inventors have realised that the idea of controlling the temperature of the semiconductor wafer during the transportation of the semiconductor wafer from the second temperature changing unit to the processing area represents a second aspect of the present invention.

Therefore, according to a second aspect of the present invention there is provided a semiconductor wafer processing method comprising: controlling the temperature of a semiconductor wafer to be within a predetermined processing temperature range by causing a change in the temperature of the semiconductor wafer using a temperature changing unit; transporting the semiconductor wafer from the temperature changing unit to a processing area of a semiconductor wafer processing apparatus; and controlling the temperature of the semiconductor wafer during the transporting step.

By controlling the temperature of the semiconductor wafer during the transportation step the temperature of the semiconductor wafer when it is loaded onto the processing area may be better controlled. As such, errors due to temperature differences between the semiconductor wafer and the processing area (and/or errors due to the heat load on the processing area from the semiconductor wafer) may be avoided or made constant/predictable.

The method according to the first and/or second aspects of the present invention may have any one, or, to the extent that they are compatible, any combination of the following optional features.

The temperature changing unit may comprise a thermal transfer plate.

The temperature of the semiconductor wafer during the transporting step may be controlled to be substantially the same as the temperature of the temperature changing unit and/or the temperature of the semiconductor wafer as it leaves the temperature changing unit.

The method may comprise a semiconductor wafer metrology method, and the semiconductor wafer may be transported from the temperature changing unit to a measurement area of a semiconductor wafer metrology apparatus.

The method may comprise controlling the temperature of a semiconductor wafer transporter used to transport the semiconductor wafer. For example, the method may comprise controlling the temperature of a robotic arm and/or an end effector used to transport the semiconductor wafer.

The temperature of the semiconductor wafer transporter may be controlled to be substantially the same as the temperature of the processing area of the semiconductor wafer processing apparatus, or substantially the same as the temperature of the temperature changing unit and/or the temperature of the semiconductor wafer as it leaves the temperature changing unit.

The method may comprise controlling the temperature of a volume of air through which the semiconductor wafer is transported. For example, the semiconductor wafer may be transported downstream though a region of an EFEM in which there is a flow of air used to maintain a clean room environment. In that case, the method may comprise controlling the temperature of the flow of air, e.g. the temperature of the flow of air at a specific location, such as adjacent to the thermal transfer plate. For example, the method may comprise providing one or more heaters to heat the flow of air. The method may also comprise adjusting the temperature of the one or more heaters and/or adjusting a speed of the flow of air to control the temperature of the flow of air. For example, the one or more heaters may be positioned downstream of one or more fans that create the flow of air.

The temperature of the volume of air may be controlled to be substantially the same as the temperature of the processing area of the semiconductor wafer processing apparatus, or substantially the same as the temperature of the temperature changing unit and/or the temperature of the semiconductor wafer as it leaves the temperature changing unit.

The method may comprise moving the semiconductor wafer from the temperature changing unit to the processing area in a minimal time, e.g. by taking the most direct route and/or by moving at the fastest possible speed, in order to limit the amount of time between the semiconductor wafer being removed from the temperature changing unit and being placed on the processing area.

The method may comprise minimising a contact area between an end effector used to transport the semiconductor wafer and the semiconductor wafer, in order to limit thermal conduction between the end effector and the semiconductor wafer. For example, the end effector may only contact the semiconductor wafer at an edge of the semiconductor wafer. Furthermore, the method may comprise using poor (or low) conductivity materials in the end effector, so that there is poor thermal conductivity between the end effector and the semiconductor wafer.

The method may comprise heating the processing area of the processing apparatus to a temperature above ambient temperature, e.g. using one or more heaters attached to the processing area (e.g. attached to a processing enclosure, such as a measurement enclosure). Heating the processing area means that the temperature during transportation can be controlled with one or more heaters to be the same as the temperature of the processing area. For example, the processing temperature may be heated by a few ° C. (for example less than 4° C.) above ambient temperature.

Alternatively, the method may comprise cooling the processing area of the processing apparatus to a temperature below ambient temperature, e.g. using one or more coolers. Cooling the processing area means that the temperature during transportation can be controlled with one or more coolers to be the same as the temperature of the processing area. For example, the processing area may be cooled by a few ° C. below ambient temperature.

According to a third aspect of the present invention there is provided a semiconductor wafer processing apparatus comprising:

a first temperature changing unit for causing a first change in the temperature of a semiconductor wafer;

a second temperature changing unit for subsequently causing a second change in the temperature of the semiconductor wafer; and a processing area.

With the apparatus according to the third aspect of the present invention the first temperature changing unit can be used to remove the bulk of a heat load from the semiconductor wafer before the temperature of the semiconductor wafer is controlled to be within a predetermined processing temperature range using the second temperature changing unit. As such, the heat load on the second temperature changing unit when it is used to control the temperature of the semiconductor wafer to be within the predetermined processing temperature range may be significantly reduced relative to the conventional apparatus, and significant temperature change of the second temperature changing unit may be avoided. Therefore, the apparatus according to the third aspect of the present invention may be able to perform the semiconductor wafer processing more accurately than the conventional apparatus.

The apparatus may comprise a semiconductor wafer metrology apparatus, and the processing area may comprise a measurement area. Therefore, the apparatus according to the third aspect of the present invention may be able to perform semiconductor wafer metrology more accurately than conventional apparatus.

The first temperature changing unit may comprise a first cooling unit for cooling the semiconductor wafer.

The first cooling unit may be arranged to remove heat from the semiconductor wafer and dissipate (or transport) that heat away from the processing area of the semiconductor wafer processing apparatus. Therefore, the heat removed from the semiconductor wafer when the semiconductor wafer is cooled using the first cooling unit may not be transported into the processing area. As such, this heat may have no effect on the temperature of the processing area and the temperature of the processing area may remain substantially constant.

The first cooling unit may be arranged to actively dissipate heat removed from the semiconductor wafer. For example, the first cooling unit may comprise means for removing heat from the first cooling unit to artificially increase the amount of heat dissipated by the first cooling unit. For example, the first cooling unit may comprise means for passing a fluid, e.g. a liquid or gas, through or from a part of the first cooling unit to actively remove heat from the first cooling unit. Such means may comprise pipes and/or valves and/or a pump or fan. The first cooling unit may be connected to a power supply for supplying power to the first cooling unit to cause the first cooling unit to actively dissipate heat.

Actively dissipating heat from the first cooling unit may prevent the temperature of the first cooling unit from increasing when causing the first temperature change of the semiconductor wafer. In particular, this may prevent the build-up of heat in the first cooling unit when processing a sequence of semiconductor wafers, where there may be a significant thermal load on the first cooling unit (which removes the bulk of the heat load from the semiconductor wafers). In other words, the bulk of the heat removed from the semiconductor wafers may be effectively/efficiently dissipated away by the first cooling unit.

The first cooling unit may comprise a thermoelectric cooler.

The first temperature changing unit may comprise a first thermal transfer plate.

The second temperature changing unit may comprise a second cooling unit for cooling the semiconductor wafer. In other words, the first cooling unit may remove the bulk of the heat load from the semiconductor wafer and the second cooling unit may perform the remaining cooling necessary to substantially match the temperature of the semiconductor wafer to the desired processing temperature.

The second cooling unit may be arranged to actively dissipate heat removed from the semiconductor wafer.

The second temperature changing unit may comprise a second thermal transfer plate.

The second thermal transfer plate may be at substantially the same temperature as the processing area of the semiconductor wafer processing apparatus. For example, the second thermal transfer plate may be substantially in thermal equilibrium with the processing area. Therefore, the second thermal transfer plate may be used to substantially equalise or match the temperature of the semiconductor wafer to the temperature of the processing area. This may substantially remove any errors that may otherwise occur if there is a temperature difference between the semiconductor wafer and the processing area.

The second thermal transfer plate may be thermally coupled to the processing area of the semiconductor wafer processing apparatus, e.g. so that the second thermal transfer plate is in thermal equilibrium with the processing area. For example, the second thermal transfer plate may be in physical contact with the processing area which may comprise thermally conductive material.

The second thermal transfer plate may be integral to the processing area of the semiconductor wafer processing apparatus. In other words, the second thermal transfer plate may be part of the processing area, e.g. formed at an outer surface of the processing area.

The apparatus may comprise a weighing apparatus. In other words, the apparatus may be usable to determine information relating to the weight of the semiconductor wafer, for example the weight or a change in the weight of the semiconductor wafer. The apparatus may be able to determine information relating to the weight or a change in the weight of the semiconductor wafer with higher accuracy than conventional apparatus.

The apparatus may be integral with, or adjacent to, another processing apparatus, for example as part of a semiconductor wafer production line. Therefore, semiconductor wafers may be directly transported from the other processing apparatus to the apparatus, without first being stored in a FOUP. Alternatively, or in addition, semiconductor wafers may be directly transported from the apparatus to the other processing apparatus, without first being stored in a FOUP. In some cases, semiconductor wafers may be transported from the apparatus directly to the other processing apparatus and then directly back to the apparatus. For example, where the apparatus is a metrology apparatus it may be used to perform metrology of a semiconductor wafer both before and after processing of the semiconductor wafer by the other processing apparatus.

The apparatus may comprise a semiconductor wafer transporter for transporting the semiconductor wafer from the second temperature changing unit to the processing area of the semiconductor wafer processing apparatus, and temperature control means for controlling the temperature of the semiconductor wafer during the transporting. Controlling the temperature of the semiconductor wafer during the transporting may help to eliminate errors caused by temperature differences between the semiconductor wafer and the processing area, or to make these errors more predicable or constant. Therefore, the accuracy of the apparatus may be greater.

According to a fourth aspect of the present invention there is provided a semiconductor wafer processing apparatus comprising:

a temperature changing unit for causing a change in the temperature of a semiconductor wafer;

a semiconductor wafer transporter for transporting the semiconductor wafer from the temperature changing unit to a processing area of a semiconductor wafer processing apparatus; and temperature control means for controlling the temperature of the semiconductor wafer during the transporting.

By controlling the temperature of the semiconductor wafer during the transportation step the temperature of the semiconductor wafer when it is loaded onto the processing area may be better controlled. As such, errors due to temperature differences between the semiconductor wafer and the processing area may be avoided or made constant/predictable.

The apparatus according to the third and/or fourth aspects of the present invention may have any one, or, to the extent that they are compatible, any combination of the following optional features.

The temperature changing unit comprises a thermal transfer plate.

The apparatus may comprise a semiconductor wafer metrology apparatus; and the semiconductor wafer transporter may be for transporting the semiconductor wafer from the temperature changing unit to a measurement area of the semiconductor wafer metrology apparatus.

The apparatus may comprise a further temperature changing unit (e.g. a heater) arranged to change the temperature of the semiconductor wafer transporter. For example, the temperature changing unit may be arranged to heat (or cool) a robotic arm and/or an end effector used to transport the semiconductor wafer.

The apparatus may comprise a further temperature changing unit (e.g. a heater) arranged to heat (or cool) a volume (or region) of air (or gas) through which the semiconductor wafer is transported. For example, the apparatus may comprise an EFEM having a flow of air, used to maintain a clean room environment in the EFEM, through which the semiconductor wafer is transported and the further temperature changing unit may be arranged to change the temperature of the flow of air. For example, the further temperature changing unit may be arranged to heat (or cool) the volume of air to a temperature substantial equal to the temperature of the (second) temperature changing unit, or the temperature of the processing area.

The further temperature changing unit may comprise a heater.

The apparatus may comprise a temperature sensor, and a controller arranged to control the further temperature changing unit (e.g. a heater) based on an output of the temperature sensor. For example, where the further temperature changing unit is arranged to heat (or cool) a volume of air through which the semiconductor wafer is transported, the temperature sensor may be located within that volume of air, for example adjacent the thermal transfer plate. When the temperature detected by the temperature sensor is less than a desired temperature, the controller may control the further temperature changing unit to provide more heat to the volume of air.

The apparatus may comprise a fan for blowing air across the further temperature changing unit (e.g. a heater) to change the temperature of the volume of air through which the semiconductor wafer is transported. For example, the fan may be a fan of the EFEM that provides the flow of air necessary to maintain a clean room environment.

The apparatus may comprise a temperature sensor, and a controller arranged to control the fan based on an output of the temperature sensor. For example, when the temperature detected by the temperature sensor is less than a desired temperature, the controller may control the fan to increase the flow of air across the further temperature changing unit to provide more heat to the volume of air. This arrangement may be particularly advantageous for responding to short-term, or small, fluctuations or changes in the temperature of the volume of air. There may be a significant lag between a controller telling a heater to warm up or cool down and the heater warming up or cooling down to the required temperature, due to the significant thermal mass of the heater. Therefore, it may be difficult to prevent short-term fluctuations of the temperature of the volume of air by adjusting the temperature of a heater. In contrast, it may be possible to very quickly change the speed of the fan to increase or decrease the flow of air across the heater. Therefore, adjusting the speed of the fan may be a good way to prevent or to counteract short-term fluctuations in the temperature of the volume of air.

The semiconductor wafer transporter may comprise a robotic arm, or an end effector of the robotic arm. For example, the robotic arm may be the robotic arm of an EFEM.

The apparatus may comprise a further semiconductor wafer transporter for transporting the semiconductor wafer on to the temperature changing unit before the semiconductor wafer is transported from the temperature changing unit to the processing area of the semiconductor wafer processing apparatus. For example the first semiconductor wafer transporter may be a first end effector and the further semiconductor wafer transporter may be a second end effector. Using separate wafer transporters (e.g. end effectors) may be advantageous as it may mean that the temperatures of the wafer transporters are more closely matched to the temperatures of the semiconductor wafers that they are used to transport. The semiconductor wafer transporter used to transport a semiconductor wafer from a FOUP to the thermal transfer plate might be relatively hot, because the wafers in the FOUP might be hot (e.g. they may be approximately 70° C.). If the same semiconductor wafer transporter is used to transport the semiconductor wafer from the thermal transfer plate to the processing area after the wafer has been cooled (e.g. to 20° C.) the semiconductor wafer transporter may transfer heat to the semiconductor wafer and increase its temperature. This may be avoided by using a different semiconductor wafer transporter to transport the semiconductor wafer from the thermal transfer plate to the processing area.

The end effector(s) may be configured so that there is a minimal or reduced thermal contact area between the end effector(s) and the semiconductor wafer, in order to minimise heat transfer between the end effector(s) and the semiconductor wafer. For example, the end effector(s) may contact the semiconductor wafer solely at the edge of the semiconductor wafer. Alternatively, or in addition, the end effector(s) may be made out of a material(s) with a poor thermal conductivity, i.e. a thermal insulator, to minimise heat transfer between the end effector(s) and the semiconductor wafer.

The apparatus may comprise heating means (e.g. one or more heaters, for example attached to the processing area, e.g. a processing chamber or enclosure of the processing area) for heating the processing area to a temperature above ambient temperature (e.g. by a few ° C., for example less than 4° C. above ambient). Separately heating both the processing area and the semiconductor wafer transporter may be an efficient and simple way of controlling the temperature of the semiconductor wafer during transportation of the semiconductor wafer to be the same as the temperature of the processing area.

Alternatively, the apparatus may comprise cooling means (e.g. one or more coolers) for cooling the processing area to a temperature below ambient temperature. In this case, the processing area and the semiconductor wafer transporter may both be separately cooled so that the temperature of the semiconductor wafer during transportation is controlled to be the same as the temperature of the processing area.

BRIEF DESCRIPTION OF THE DRAWINGS

Embodiments of the present invention will now be discussed, by way of example only, with reference to the accompanying Figures, in which.

DETAILED DESCRIPTION OF THE PREFERRED EMBODIMENTS AND FURTHER OPTIONAL FEATURES OF THE INVENTION

Figure 1:
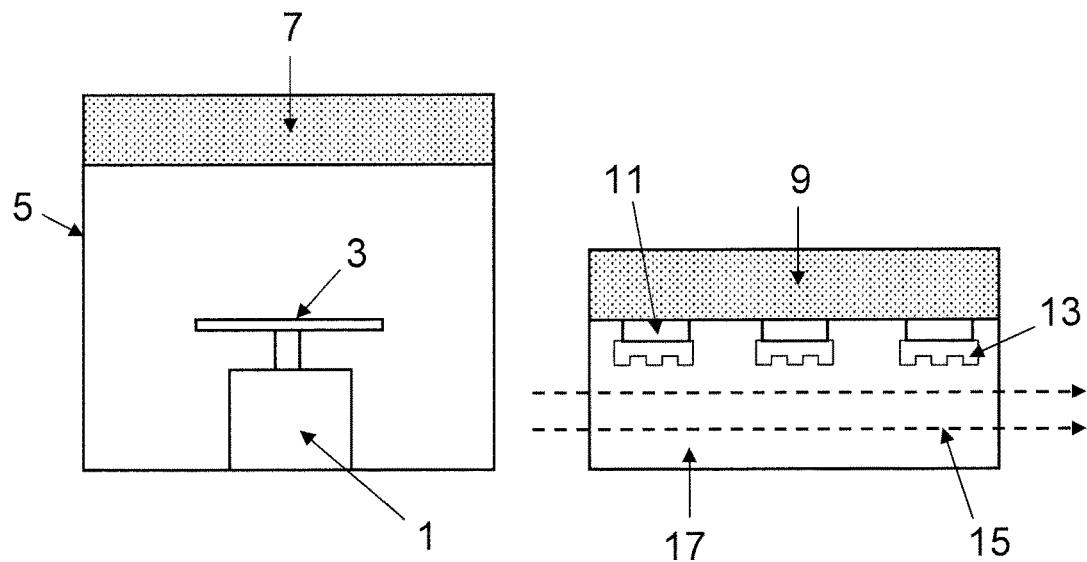
FIG. 1 shows a weighing apparatus according to a first embodiment of the present invention.

FIG. 1 shows a weighing apparatus according to a first embodiment of the present invention. The weighing apparatus comprises a weighing balance 1 having a weighing pan 3 for receiving a semiconductor wafer. The weighing balance 1 is configured to provide measurement output indicative of the weight of a semiconductor wafer loaded on the weighing pan 3.

The weighing balance 1 is located within a weighing chamber 5, which forms an enclosed environment around the weighing balance 1, e.g. to maintain a substantially uniform air density, air pressure and air temperature of the air around the weighing balance and to prevent draughts and provide electromagnetic shielding. The weighing chamber 5 has an opening (not shown), e.g. a suitably sized slot in a side-wall of the weighing chamber 5, to allow a semiconductor wafer to be transported into the weighing chamber 5, e.g. by a robotic arm, and positioned on the weighing pan 3. When not in use, the opening may be covered by an openable door or covering (not shown) to allow the weighing chamber 5 to be substantially closed or sealed when performing measurements using the weighing balance 1.

A thermal transfer plate 7 (a "second temperature changing unit") is positioned on top of the weighing chamber 5. The thermal transfer plate 7 comprises a block of material having a good thermal conductivity (for example Al). The thermal transfer plate also preferably has a high thermal mass, so that its temperature changes slowly and little when it is supplied with heat, and a good lateral thermal conductivity, so that it maintains a substantially uniform temperature across its upper surface. In this embodiment, the thermal transfer plate 7 is made from aluminium, but in other embodiments any other material with a good thermal conductivity may be used.

The thermal transfer plate 7 is positioned directly on top of the weighing chamber 5, so that there is a good thermal contact between the thermal transfer plate 7 and the weighing chamber 5. The thermal transfer plate 7 is in direct physical contact with the weighing chamber 5. The thermal transfer plate 7 may be attached or fixed to the weighing chamber 5, for example using one or more bolts (not shown) and/or a thermally conductive bonding layer (not shown).

As a result of the good thermal contact between the thermal transfer plate 7 and the weighing chamber 5, the thermal transfer plate 7 may be substantially in thermal equilibrium with the weighing chamber 5 and therefore may have substantially the same temperature as the weighing chamber 5. The weighing balance 1 may also be in thermal equilibrium with the weighing chamber 5 and therefore may also have substantially the same temperature as the weighing chamber 5. As such, the thermal transfer plate 7 may be substantially in thermal equilibrium with the weighing balance 1 and therefore may have substantially the same temperature as the weighing balance 1.

The weighing balance 1 and the weighing pan 3 may be considered as comprising a measurement area of the weighing apparatus. Alternatively, the weighing chamber 5 may be considered as comprising a measurement area of the weighing apparatus.

The weighing apparatus of FIG. 1 further comprises a further thermal transfer plate 9 (A "first temperature changing unit"). A plurality of Peltier devices 11 are attached to a bottom side of the thermal transfer plate 9. Each Peltier device 11 has a heat sink 13 attached to the bottom side thereof. An air flow 15 can be provided in a region 17 beneath the bottom side of the thermal transfer plate 9 in order to remove heat from the Peltier devices 11 and from the heat-sinks 13. Of course, the configuration of the air flow may be different to that shown in FIG. 1, for example, air may be blown out of the bottom the region 17 by a fan.

In FIG. 1 the thermal transfer plate 9 is shown as being positioned to the right-hand side of the weighing chamber 5. However, in other embodiments the thermal transfer plate 9 can be positioned differently, for example to a different side, above or below the weighing chamber 5, or closer or further away from the weighing chamber 5 than illustrated in FIG. 1. In other embodiments, the thermal transfer plate 9 may be attached or connected, directly or indirectly, to the thermal transfer plate 7.

In use, a wafer transporter, for example an end effector of a robotic arm of a EFEM, is used to remove a semiconductor wafer from a FOUP (not shown), or alternatively from another processing apparatus (not shown), and to transport the semiconductor wafer to the thermal transfer plate 9 and position the semiconductor wafer on the thermal transfer plate 9. When the semiconductor wafer is removed from the FOUP (or the other processing apparatus) it may have a temperature of approximately 70° C. For example, the semiconductor wafer may have been processed at a processing station of a semiconductor device production line, which may have heated the semiconductor wafer to a temperature of 400 to 500° C., before the semiconductor wafer was loaded into the FOUP.

When the semiconductor wafer is positioned on the thermal transfer plate 9, heat is conducted from the semiconductor wafer to the thermal transfer plate 9 so that the temperature of the semiconductor wafer is decreased. Depending on how long the semiconductor wafer is positioned on the thermal transfer plate 9, the semiconductor wafer and the thermal transfer plate 9 may achieve thermal equilibrium (e.g. so that they have substantially the same temperature). Transfer of heat from the semiconductor wafer to the thermal transfer plate 9 would act to increase the temperature of the thermal transfer plate 9. In that case, the thermal equilibrium temperature of the semiconductor wafer and the thermal transfer plate 9 may be different to a desired temperature of the semiconductor wafer. In order to prevent the temperature of the thermal transfer plate 9 from increasing due to the heat load from the semiconductor wafer, the thermal transfer plate 9 is operable to actively dissipate the heat load removed from the semiconductor wafer. In particular, the Peltier devices 11 are operated to actively remove heat from the thermal transfer plate 9. In other words, electrical power is supplied to the Peltier devices 11 to cause them to act as active heat pumps that transfer heat from their upper surfaces in contact with the thermal transfer plate 9 to their lower surfaces to which the heat-sinks 13 are attached.

An air-flow 15 is provided in the region 17 beneath the thermal transfer plate 9 in which the Peltier devices 11 and the heat-sinks 13 are positioned in order to remove heat from the Peltier devices 11 and the heat-sinks 13. The heat removed from the semiconductor wafer using the thermal transfer plate 9 is therefore transported and dissipated away from the weighing chamber 5 of the weighing apparatus by the air-flow 15, so that this heat has no effect on the temperature of the weighing apparatus. The air-flow 15 may be generated by one or more fans, for example posited in, or at the edges of, the region 17. In other words, heat is actively dissipated from the thermal transfer plate 9.

As mentioned above, actively dissipating heat from the thermal transfer plate 9 will prevent heat from building up in the thermal transfer plate 9, which would cause an increase in the temperature of the thermal transfer plate 9. In this embodiment, the heat removed from the semiconductor wafer is effectively/efficiently disposed of by being dissipated by the thermal transfer plate 9. This may enable the temperature of the semiconductor wafer to be more precisely/accurately controlled using the thermal transfer plate 9.

In some embodiments, the thermal transfer plate 9 may be cooled to a temperature below the desired temperature of the semiconductor wafer, so that the semiconductor wafer is cooled more rapidly. In this case, a pyrometer or other temperature sensor may be used to monitor the temperature of the semiconductor wafer and it may be removed from the thermal transfer plate 9 when it reaches an appropriate temperature. This may increase the speed with which the semiconductor wafer can be cooled by the thermal transfer plate 9. Alternatively, the thermal transfer plate 9 may be held at a first temperature below the desired temperature of the semiconductor wafer for a period of time, in order to rapidly cool the semiconductor wafer, and then held at the desired temperature after that time (so that it is not necessary to precisely monitor the temperature of the semiconductor wafer and remove it at the appropriate time).

The thermal transfer plate 9 is operated to remove a bulk of a heat load from the semiconductor wafer, so that the temperature of the semiconductor wafer is reduced to close to the desired temperature of the semiconductor wafer when it is positioned on the weighing pan 3. The thermal transfer plate 9 may remove over 90%, or over 95%, of the heat that needs to be removed to reduce the temperature of the semiconductor wafer to the desired temperature. Put another way, the thermal transfer plate 9 may cause over 90%, or over 95%, of the temperature change required to decrease the temperature of the semiconductor wafer from its initial temperature to the desired temperature when it is positioned on the weighing pan 3.

In this embodiment, it is desired to substantially match the temperature of the semiconductor wafer to the temperature of the weighing chamber 5, so that there is substantially no temperature difference between the semiconductor wafer and the weighing chamber 5 (and therefore substantially no temperature difference between the semiconductor wafer and the weighing balance 1) when the semiconductor wafer is loaded on the weighing pan 3. In this embodiment, the thermal transfer plate 9 may cool the semiconductor wafer to within ±1° C. of the temperature of weighing chamber 5. For example, where the weighing chamber has a temperature of 20° C., the thermal transfer plate 9 may cool the semiconductor wafer to a temperature of (20±1°) C. However, in other embodiments the amount of cooling provided by the thermal transfer plate 9 may be different to this, provided that as a minimum the thermal transfer plate 9 provides over 50% of the required temperature change of the semiconductor wafer, and preferably over 80%.

Once the semiconductor wafer has been cooled to a temperature close to the desired temperature using the thermal transfer plate 9, it is transported to the thermal transfer plate 7 using a wafer transporter. Preferably, a different wafer transporter is used to transport the semiconductor wafer to the thermal transfer plate 7 than was used to transport the semiconductor wafer to the thermal transfer plate 9. In this embodiment, two different end effectors of a robotic arm of an EFEM are used to perform the two different transportation steps. The end effector that transports the semiconductor wafer to the thermal transfer plate 9 may be heated by the semiconductor wafer 9. If the same end effector is used to transport the cooled semiconductor wafer from the thermal transfer plate 9 to the thermal transfer plate 7 it may transfer heat back to the semiconductor wafer, thereby changing its temperature. This problem may be avoided by using a different end effector for the second transportation step.

The end effector(s) may be configured so that there is a minimal or reduced thermal contact area between the end effector(s) and the semiconductor wafer, in order to minimise heat transfer between the end effector(s) and the semiconductor wafer. For example, the end effector(s) may contact the semiconductor wafer solely at the edge of the semiconductor wafer. Alternatively, or in addition, the end effector(s) may be made out of a material(s) with a poor thermal conductivity, i.e. a thermal insulator, to minimise heat transfer between the end effector(s) and the semiconductor wafer.

As discussed above, when the semiconductor wafer is positioned on the thermal transfer plate 7 there is good thermal contact between the semiconductor wafer and the thermal transfer plate 7. Therefore, the semiconductor wafer is cooled by heat being conducted from the semiconductor wafer to the thermal transfer plate 7. Depending on the length of time that the semiconductor wafer is positioned on the thermal transfer plate 7, the semiconductor wafer and the thermal transfer plate 7 may become substantially in thermal equilibrium, so that they have substantially the same temperature (i.e. the temperature of the semiconductor wafer is matched or equalised to the temperature of the thermal transfer plate 7 and therefore to the temperature of the weighing chamber 5). In this embodiment, the semiconductor wafer may be positioned on the thermal transfer plate 7 for a period of up to 60 seconds.

The semiconductor wafer has already had the bulk of its heat load removed by the thermal transfer plate 9 before it is positioned on the thermal transfer plate 7. Therefore, the thermal load on the thermal transfer plate 7 during the temperature equalisation is very low, and the temperature of the thermal transfer plate 7 and the weighing chamber 5 (which have a high thermal mass) therefore remains substantially constant during the temperature equalisation. In addition, relatively little heat has to be exchanged to bring the semiconductor wafer into thermal equilibrium with the thermal transfer plate 7.

Therefore, with the present embodiment it may be possible to more accurately/precisely equalise the temperature of the semiconductor wafer to the desired temperature, because the steps of removing the bulk of the heat load from the semiconductor wafer and equalising the temperature of the semiconductor wafer have been separated. For example with the present embodiment it may be possible to match the temperature of the semiconductor wafer to the temperature of the weighing chamber 5 to an accuracy of less than 0.1° C., or to an accuracy of less than 0.01° C., or even to an accuracy of the order of 0.001° C.

When the temperature of the semiconductor wafer is substantially equalised to the temperature of the weighing chamber 5 (e.g. when the semiconductor wafer has been on the thermal transfer plate 7 for a predetermined period of time) the semiconductor wafer is transported by a wafer transporter from the thermal transfer plate 7 to the weighing pan 3. The weighing balance 1 is then used to provide measurement output indicative of the weight of the semiconductor wafer. Because the temperature of the semiconductor wafer has been substantially matched to the temperature of the weighing chamber, and without significantly changing the temperature of the weighing chamber (as the heat load on the weighing chamber is very small), any temperature errors in the measurement output may be substantially zero. For example, there may be no significant convection currents generated in the weighing chamber 5, no significant changes in the buoyancy force on the semiconductor wafer (which would be caused by heating of the air in the weighing chamber 5), and no significant temperature changes (e.g. temperature increase or temperature non-uniformity) in the weighing balance 1 due to the presence of the semiconductor wafer on the weighing pan 3.

Similarly to above, a different end effector may be used to transport the semiconductor wafer from the thermal transfer plate 7 to the weighing pan 3.

Figure 2:
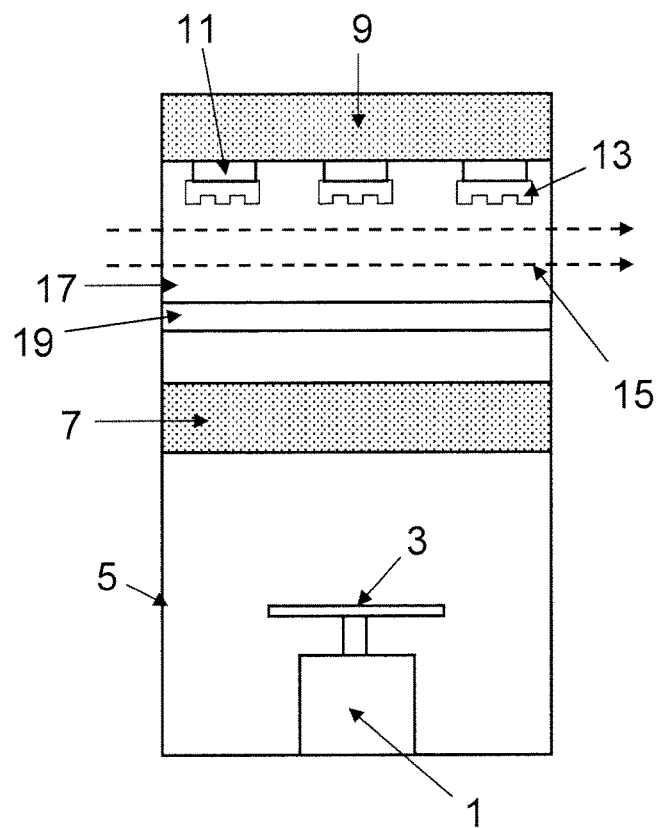
FIG. 2 shows a weighing apparatus according to a second embodiment of the present invention.

FIG. 2 shows a weighing apparatus according to a second embodiment of the present invention. Similar or corresponding features to those present in FIG. 1 are indicated using the same reference numerals as used in FIG. 1, and description of those features is not repeated.

The primary difference between the first and second embodiments is the positioning of the thermal transfer plate 9. In the second embodiment, the thermal transfer plate 9 is stacked above the thermal transfer plate 7. A thermal gap 19, for example an air gap or a layer of insulating material, is positioned between the thermal transfer plate 7 and the thermal transfer plate 9, so that the thermal transfer plates 7, 9 are substantially thermally insulated from each other so that substantially no heat can pass between the thermal transfer plates 7, 9.

Floor space is often limited in semiconductor device production facilities. Therefore, it may be advantageous to stack the thermal transfer plate 9 above the thermal transfer plate 7, i.e. similarly to the arrangement shown in FIG. 2, in order to save floor space. In this arrangement, the semiconductor wafer is transported vertically between the thermal transfer plates 7, 9 and the weighing pan 3.

Figure 3:
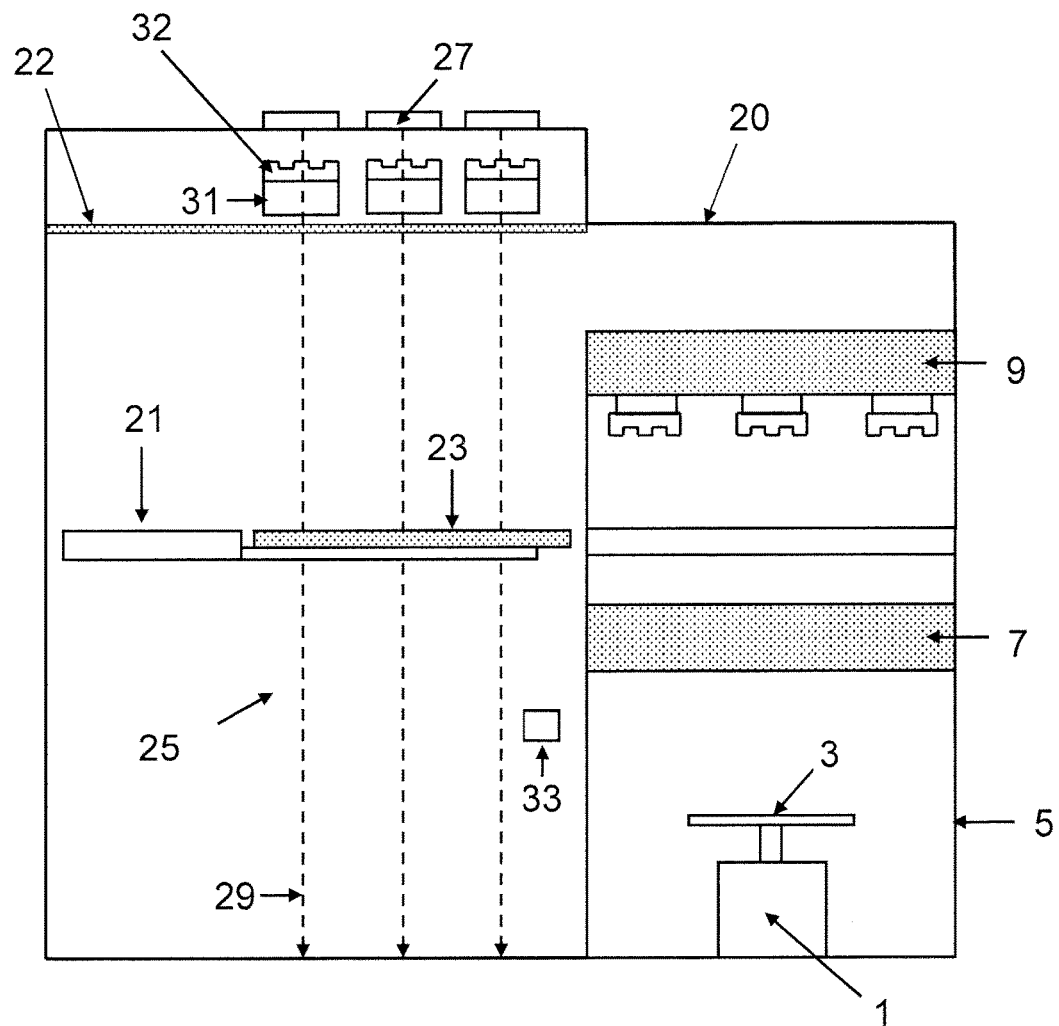
FIG. 3 shows a weighing apparatus according to a third embodiment of the present invention, including a wafer transporter.

FIG. 3 shows a weighing apparatus according to a third embodiment of the present invention including a wafer transportation system. Similar or corresponding features to those present in FIG. 1 are indicated using the same reference numerals as used in FIG. 1, and description of those features is not repeated. As shown in FIG. 3, the weighing apparatus and wafer transportation system are enclosed in an EFEM enclosure 20, within which a clean room environment is maintained/generated. As shown in FIG. 3, the wafer transportation system comprises one or more end effectors 21 of a robotic arm, for example a robotic arm of an EFEM. The end effector 21 is used to hold or support a semiconductor wafer 23 and to transport the semiconductor wafer 23 between the different parts of the weighing apparatus, e.g. between the thermal transfer plate 9, the thermal transfer plate 7 and the weighing pan 3.

As shown in FIG. 3, when the end effector 21 transports the semiconductor wafer 23 it transports the semiconductor wafer 23 vertically through some or all of a region 25, which in this embodiment is a vertical region, e.g. a vertical column of air or gas. A plurality of fans 27 are arranged to blow air (or gas) into or through the region 25 in order to generate an air flow 29 through the region 25.

The semiconductor wafer may be positioned on the thermal transfer plates 7, 9 or on the weighing pan 3 by passing the semiconductor wafer through a lid, opening or slot in an enclosure or chamber (for example the weighing chamber 5). There may be a cover, door or similar covering the lid, opening or slot, which may be opened and closed where necessary.

In this embodiment, the wafer transportation system is part of an EFEM and the air flow 29 through the region 25 is an air flow of the EFEM that is used to maintain clean-room conditions within the EFEM enclosure 20 (including in the weighing chamber 5). A filter (22) is included downstream of the plurality of fans 27 in order to filter the air flow 29 so as to maintain clean-room conditions.

Heaters 31 are positioned downstream of the fans 27 (i.e. below the fans 27 in the arrangement illustrated in FIG. 3). Each of the heaters 31 has a heat sink 32 attached to an upper surface (an upstream surface) thereof, for facilitating transfer of heat from the heaters 31 to the air flow 29 generated by the fans 27. The heaters 31 are arranged so that the air flow 29 passes over or around or through the heat sinks 32.

The heaters 31 can be operated to heat the air flow 29, so as to heat the air in the region 25 through which the semiconductor wafer 23 is transported.

The specific number of heaters 31, heat sinks 32 and fans 27 can be varied from the numbers shown in FIG. 3. For example, it is not essential to have the same number of fans 27 as heaters 31, or for each heater 31 to have a heat sink 32, or for there to be more than one heater 31, heat sink 32 or fan 27.

A temperature sensor 33 is positioned in the region 25. In this embodiment, the temperature sensor 33 is positioned part way between the thermal transfer plate 7 and the weighing pan 3 in order to measure the temperature at that location. In other embodiments, the temperature sensor may be located elsewhere in the region 25, and/or there may be more than one temperature sensor in the region 25. For example, there may be one temperature sensor for each heater 31 and/or fan 27.

A controller (not shown) is in communication with the temperature sensor 33 and also in communication with the plurality of heaters 31 and is arranged to control the operation (e.g. the temperature) of the plurality of heaters 31, so as to control the temperature of the air flow 29 based on the output of the temperature sensor 33.

One or more heaters (not shown) may also be provided to heat the weighing chamber 5 to a temperature above ambient temperature, by e.g. a few ° C. (for example by less than 4° C.) The heaters may control the temperature of the weighing chamber 5 so that it is a constant or uniform temperature.

An advantage of heating the weighing chamber 5 is that the temperature of the air flow 29 in the region 25 can then easily/simply be controlled to be the same as the temperature of the weighing chamber 5 (or to have a fixed relationship to the temperature of the weighing chamber 5) by heating the air flow 29 with the heaters 31 so that it is the same temperature as the temperature of the weighing chamber 5.

In use, the fans 27 are operated to provide the air flow 29, in order to generate clean room conditions. The temperature sensor 33 is operated to detect the temperature of the air flow 29 at the location of the temperature sensor 33, e.g. proximal to the thermal transfer plate 7 and the weighing pan 3. If the temperature detected by the temperature sensor 33 is less than the desired temperature of the semiconductor wafer 23 when it is loaded on the weighing pan 3, e.g. less than the temperature of the weighing chamber 5, then the controller controls the heaters 31 to generate heat (or to generate more heat) so that the temperature of the air flow 29 is increased until the temperature detected by the temperature sensor 33 is substantially equal to the desired temperature. The temperature of the air flow 29 at the location of the temperature sensor 33 may be controlled to be substantially equal to the temperature of the weighing chamber 5.

In this way, the temperature of the air flow 29 through the region 25 can be controlled to be substantially the same as the temperature of the weighing chamber 5.

Alternatively, the controller may control the temperature at the temperature sensor 33 to be the same as a predetermined temperature programmed into the controller.

The heaters 31 may have a relatively high thermal mass. Therefore, there may be a significant lag time between the controller controlling the heaters 31 to supply more heat to the air flow 29 and the heaters 31 heating up to the necessary temperature. Therefore, it may be difficult to counteract or to prevent small fluctuations in the temperature of the air flow 29 by only adjusting the temperature of the heaters 31.

Therefore, in some embodiments of the present invention the controller may additionally be in communication with one or more of the fans 27 in order to control the operation of the fans 27, e.g. to control a speed or a rate of air flow of the fans 27

It may be possible to change the speed of the fans 27 very rapidly. If the speed of the fans 27 is increased, more air will be blown across the heaters 31 and the temperature of the air flow 29 may increase. Conversely, if the speed of the fans 27 is decreased, less air will be blown across the heaters 31 and the temperature of the air flow 29 may decrease. If the temperature sensor detects a small deviation in the temperature of the air flow 29 from the desired temperature, e.g. a small decrease in the temperature of the air flow 29, the controller may control the speed of the fans 27 to counteract or to remove this deviation. The change in speed of the fans 27 and the consequential change in the temperature of the air flow 29 may be very rapid. Therefore, it may be possible to counteract or to prevent small fluctuations in the temperature of the air flow 29.

In some embodiments, both the heaters 31 and the fans 27 may be controlled simultaneously to control the temperature of the air flow 29 in the region 25. In other embodiments, the heaters 31 may be controlled to cause relatively large changes in the temperature of the air flow or to counteract changes in temperature occurring over a relatively long time periods (e.g. over 100 s), whereas the fans 27 may be controlled to cause relatively small changes in the temperature of the air flow or to counteract changes in temperature occurring over relatively short time periods (e.g. less than 100 s, for example between 10 s and 100 s).

Figure 4:
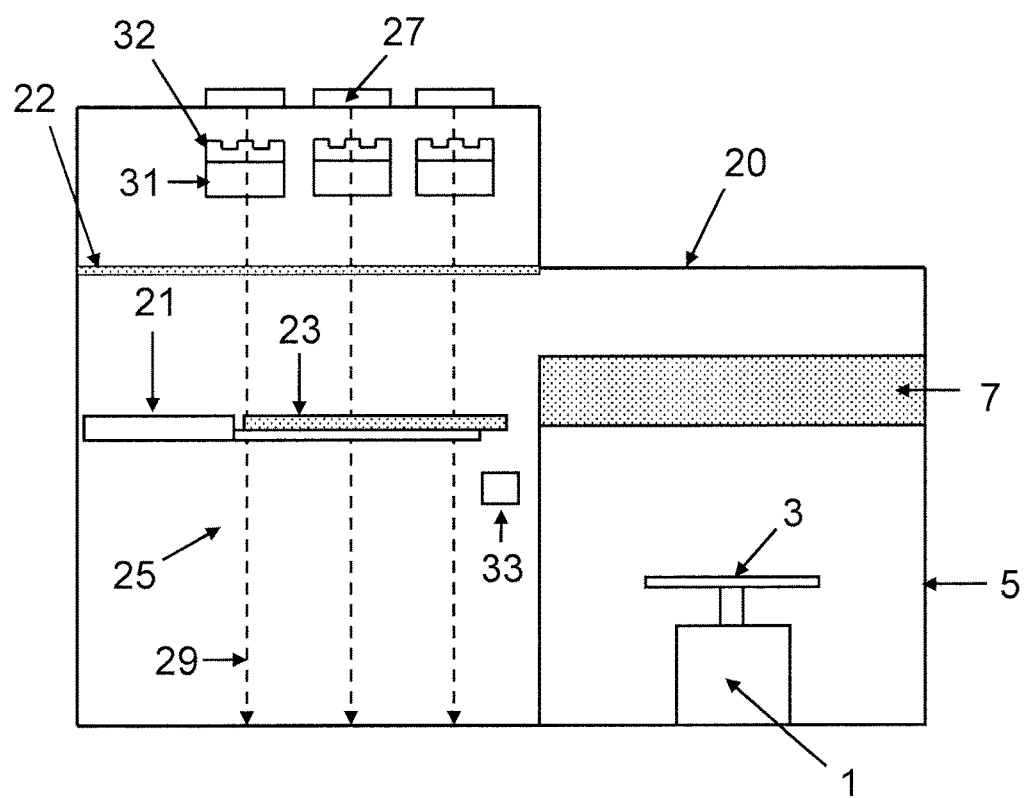
FIG. 4 shows a weighing apparatus according to a fourth embodiment of the present invention, including a wafer transporter.

FIG. 4 shows a weighing apparatus according to a fourth embodiment of the present invention, including a wafer transporter. Similar or corresponding features to those present in FIG. 3 are indicated using the same reference numerals as used in FIG. 3, and description of those features is not repeated.

The primary difference between the fourth and third embodiments is that the fourth embodiment only includes a single thermal transfer plate 7, which may correspond to the thermal transfer plate 7 of the previous embodiments. There is no thermal transfer plate 9.

Therefore, with the fourth embodiment the semiconductor wafer 23 is removed from a FOUP (or from another processing apparatus) by an end effector 23 and placed on the thermal transfer plate 7 without any pre-cooling of the semiconductor wafer 23. The temperature of the semiconductor wafer 23 is then substantially equalised to the temperature of the thermal transfer plate 7 and the weighing chamber 5. Subsequently, the semiconductor wafer is then transported by an end effector 23 from the thermal transfer plate 7 to the weighing pan 3 of the weighing balance 1.

In this embodiment, the heat load on the thermal transfer plate 7 and the weighing chamber 5 from the temperature equalisation is greater than in the previous embodiments. Therefore, there may be a more significant change in the temperature of the thermal transfer plate 7 and the weighing chamber 5 due to the temperature equalisation than in the previous embodiments, particularly when a series of measurements are performed sequentially on a sequence of semiconductor wafers 23.

Essentially, the temperature matching carried out using the thermal transfer plate 7 in this embodiment is the same as that carried out with conventional methods and apparatuses. However, the wafer transporter in this embodiment is substantially the same as that described above in relation to FIG. 3 and controls the temperature of air flow 29 in the region 25 through which the semiconductor wafer 23 is transported. Therefore, the temperature of the semiconductor wafer 23 may be maintained at the temperature of the weighing chamber 5 during the transportation, so that the temperature of the semiconductor wafer 23 is more accurately matched to the desired temperature when the semiconductor wafer is loaded on the weighing pan 3, relative to the conventional methods and apparatus. As with the previous embodiment, there may be one or more heaters (not shown) for heating the weighing chamber 5 to a temperature (a few degrees) above ambient temperature.

In other embodiments of the present invention, the temperature of the air flow 29 in the region 25 may be controlled to be a temperature different to the temperature of the weighing chamber 5. Although this arrangement may lead to the temperature of the semiconductor wafer changing during the transportation, and therefore no longer being the desired temperature, the temperature of the semiconductor wafer will at least be controlled to be a known and/or fixed value when it is loaded on the weighing pan 3. Therefore, any errors caused by the temperature difference may be known and/or predictable and therefore may be removed. As such, the resulting accuracy of the weight measurements may not be substantially the same as for embodiments in which the temperature of the air flow 29 is matched to the temperature of the thermal transfer plate 7 or the temperature of the weighing chamber 5.

Similarly, in other embodiments of the present invention the thermal transfer plate 7 may not be in thermal equilibrium with the weighing chamber 5 and may have a different temperature to the weighing chamber (and may not be attached to it or in contact with it). Again, this will lead to a temperature difference between the semiconductor wafer 23 and the measurement chamber 5, but the errors that arise from this temperature difference may be known and/or predictable and therefore may be removed (e.g. when performing comparative measurements in which two measurements, e.g. taken before and after processing of the wafer, are subtracted).

In other embodiments, the thermal transfer plate 9 may not actively dissipate heat removed from the semiconductor wafer.

In other embodiments, the thermal transfer plate 7 may actively dissipate heat removed from the semiconductor wafer. For example, the thermal transfer plate 7 may comprise peltier devices 11 and an air flow 15, similarly to the thermal transfer plate 9 as illustrated in FIGS. 1 and 2.

In some embodiments, the weighing apparatus may be integrated with another processing apparatus, or adjacent to another processing apparatus, e.g. in a semiconductor wafer processing line. In this case, semiconductor wafers may be transported directly from the processing area of the other processing apparatus to the weighing apparatus, e.g. to the thermal transfer plate 9, and/or transported directly from the apparatus to the other processing apparatus.

In other embodiments of the present invention, the thermal transfer plates 7, 9 may be used to heat the semiconductor wafer instead of to cool the semiconductor wafer. In other words, the thermal transfer plate 9 may transfer a bulk of a heat load to the semiconductor wafer to heat it to close to the desired temperature and the thermal transfer plate 7 may then equalise the temperature of the semiconductor wafer to the desired temperature.

In other embodiments of the present invention, the weighing chamber 5 may be cooled to a temperature below ambient temperature and the wafer transporter may also be cooled to match this temperature.

The apparatus according to any of the embodiments described above may be used to determine information relating the weight of a semiconductor wafer, for example the weight or a change in the weight of the semiconductor wafer. The apparatus may be used to determine a change in the weight of a semiconductor wafer caused by processing of the semiconductor wafer, e.g. on a production line for making semiconductor devices. For example, the apparatus may be used to perform measurements on the semiconductor wafer before and after processing of the semiconductor wafer, and those measurements may be used to determine a change in the weight of the semiconductor wafer caused by the processing. This information may be used to determine if the semiconductor wafer has been processed correctly and/or has the desired structure or configuration.

The invention claimed is:

1. A semiconductor wafer weighing method comprising:
controlling the temperature of a semiconductor wafer to be within a predetermined measurement temperature range by:
   causing a first change in the temperature of the semiconductor wafer using a first temperature changing unit; and
   subsequently causing a second change in the temperature of the semiconductor wafer using a second temperature changing unit, wherein the second temperature changing unit comprises a thermal transfer plate that is provided on an outer surface of a weighing chamber of a semiconductor wafer weighing apparatus and that is thermally coupled to, or integral to, the outer surface of the weighing chamber of the semiconductor wafer weighing apparatus, so that the thermal transfer plate is substantially in thermal equilibrium with the weighing chamber of the semiconductor wafer weighing apparatus and has substantially the same temperature as the weighing chamber of the semiconductor wafer weighing apparatus, wherein the semiconductor wafer is positioned on the thermal transfer plate to cause the second change in the temperature of the semiconductor wafer;
wherein the magnitude of the first change is greater than the magnitude of the second change; and
subsequently loading the semiconductor wafer on to a weighing balance of the semiconductor wafer weighing apparatus located within the weighing chamber of the semiconductor wafer weighing apparatus.

2. The method according to claim 1, wherein the magnitude of the first temperature change comprises at least 80% of the sum of the magnitudes of the first and second temperature changes.

3. The method according to claim 1, wherein causing the first change in the temperature of the semiconductor wafer comprises changing the temperature of the semiconductor wafer to be within ±3° C. of the predetermined measurement temperature.

4. The method according to claim 1, wherein causing the second change in the temperature of the semiconductor wafer comprises changing the temperature of the semiconductor wafer by less than 3° C.

5. The method according to claim 1, wherein:
the first temperature changing unit comprises a first cooling unit;
causing the first change in the temperature of the semiconductor wafer comprises cooling the semiconductor wafer using the first cooling unit;
the second temperature changing unit comprises a second cooling unit; and
causing the second change in the temperature of the semiconductor wafer comprises cooling the semiconductor wafer using the second cooling unit.

6. The method according to claim 1, wherein:
the method comprises determining information relating to the mass of the semiconductor wafer.

7. The method according to claim 1, wherein the method comprises:
transporting the semiconductor wafer from the second temperature changing unit to the weighing balance of the semiconductor wafer weighing apparatus; and
controlling the temperature of the semiconductor wafer during the transporting step.

8. A semiconductor wafer weighing method comprising:
controlling the temperature of a semiconductor wafer to be within a predetermined measurement temperature range by causing a change in the temperature of the semiconductor wafer using a temperature changing unit, wherein the temperature changing unit comprises a thermal transfer plate that is provided on an outer surface of a weighing chamber of a semiconductor wafer weighing apparatus and that is thermally coupled to, or integral to, the outer surface of the weighing chamber of the semiconductor wafer weighing apparatus, so that the thermal transfer plate is substantially in thermal equilibrium with the weighing chamber of the semiconductor wafer weighing apparatus and has substantially the same temperature as the weighing chamber of the semiconductor wafer weighing apparatus, wherein the semiconductor wafer is positioned on the thermal transfer plate to cause the change in the temperature of the semiconductor wafer; and
transporting the semiconductor wafer from the temperature changing unit to a weighing balance of the semiconductor wafer weighing apparatus located within the weighing chamber of the semiconductor wafer weighing apparatus; and
controlling the temperature of the semiconductor wafer to be substantially the same as the temperature of the semiconductor wafer as it leaves the temperature changing unit during the transporting step.

9. The method according to claim 8, wherein the method comprises controlling the temperature of a semiconductor wafer transporter used to transport the semiconductor wafer from the temperature changing unit to the weighing balance.

10. The method according to claim 8, wherein the method comprises controlling the temperature of a volume of air through which the semiconductor wafer is transported when transporting the semiconductor wafer from the temperature changing unit to the weighing balance.

11. The method according to claim 8, wherein the method comprises controlling the temperature of either a semiconductor wafer transporter used to transport the semiconductor wafer from the temperature changing unit to the weighing balance or a volume of air through which the semiconductor wafer is transported when transporting the semiconductor wafer from the temperature changing unit to the weighing balance, wherein the temperature is controlled to be substantially the same as the temperature of the weighing balance of the semiconductor wafer weighing apparatus.

12. A semiconductor wafer weighing apparatus comprising:
a weighing chamber containing a weighing balance;
a first temperature changing unit for causing a first change in the temperature of a semiconductor wafer; and a second temperature changing unit for subsequently causing a second change in the temperature of the semiconductor wafer, wherein the second temperature changing unit comprises a thermal transfer plate that is provided on an outer surface of the weighing chamber and that is thermally coupled to, or integral to, the outer surface of the weighing chamber, so that the thermal transfer plate is substantially in thermal equilibrium with the weighing chamber and has substantially the same temperature as the weighing chamber.

13. The apparatus according to claim 12, wherein the first temperature changing unit comprises a first cooling unit for cooling the semiconductor wafer; and the second temperature changing unit comprises a second cooling unit for cooling the semiconductor wafer.

14. The apparatus according to claim 12, wherein the apparatus comprises:

a semiconductor wafer transporter for transporting the semiconductor wafer from the second temperature changing unit to the weighing balance of the semiconductor wafer weighing apparatus; and temperature control means for controlling the temperature of the semiconductor wafer during the transporting.

15. A semiconductor wafer weighing apparatus comprising:

a weighing chamber containing a weighing balance;

a temperature changing unit for causing a change in the temperature of a semiconductor wafer, wherein the temperature changing unit comprises a thermal transfer plate that is provided on an outer surface of the weighing chamber and that is thermally coupled to, or integral to, the outer surface of the weighing chamber, so that the thermal transfer plate is substantially in thermal equilibrium with the weighing chamber and has substantially the same temperature as the weighing chamber;

a semiconductor wafer transporter for transporting the semiconductor wafer from the temperature changing unit to the weighing balance; and temperature control means for controlling the temperature of the semiconductor wafer to be substantially the same as the temperature of the semiconductor wafer as it leaves the temperature changing unit during the transporting.

16. The apparatus according to claim 15, wherein the apparatus comprises a first further temperature changing unit arranged to change the temperature of the semiconductor wafer transporter.

17. The apparatus according to claim 15, wherein the apparatus comprises a second further temperature changing unit arranged to change the temperature of a volume of air through which the semiconductor wafer is transported.

18. The apparatus according to claim 16, wherein the apparatus comprises:

a temperature sensor; and a controller arranged to control the first further temperature changing unit based on an output of the temperature sensor.

19. The apparatus according to claim 17, wherein the apparatus comprises a fan arranged to blow air across the second further temperature changing unit to change the temperature of the volume of air through which the semiconductor wafer is transported.

20. The apparatus according to claim 19, wherein the apparatus comprises:

a temperature sensor; and a controller arranged to control the fan based on an output of the temperature sensor.

* * * * *